United States Patent [19]

Harper et al.

[11] 4,259,145

[45] Mar. 31, 1981

[54] ION SOURCE FOR REACTIVE ION ETCHING

[75] Inventors: James M. E. Harper, Yorktown Heights, N.Y.; Harold R. Kaufman, Fort Collins, Colo.

[73] Assignee: International Business Machines Corporation, Armonk, N.Y.

[21] Appl. No.: 53,491

[22] Filed: Jun. 29, 1979

[51] Int. Cl.$^3$ .................... H05H 5/00; H01L 21/306
[52] U.S. Cl. .................... 156/643; 156/345;
156/662; 204/192 E; 313/359
[58] Field of Search .................... 156/345, 643, 662;
204/164, 298, 192 E, 192 EC; 313/359, 362,
363; 315/111.3, 111.4, 111.5, 111.6, 111.7

[56] References Cited

U.S. PATENT DOCUMENTS

| | | | |
|---|---|---|---|
| 3,177,654 | 4/1965 | Gradecak | 313/359 |
| 3,361,659 | 1/1968 | Bertelsen | 204/164 |
| 3,660,715 | 5/1972 | Post | 315/111.5 |
| 3,969,646 | 7/1976 | Reader et al. | 313/359 |
| 4,104,086 | 8/1978 | Bondur et al. | 156/643 |
| 4,119,881 | 10/1978 | Calderon | 204/298 |
| 4,139,442 | 2/1979 | Bondur et al. | 156/643 |
| 4,158,589 | 6/1979 | Keller et al. | 156/345 |

OTHER PUBLICATIONS

Vossen et al., ed. *Thin Film Processes*, Academic Press, New York, N.Y., (1978), pp. 497–553.

*Primary Examiner*—Jerome W. Massie
*Attorney, Agent, or Firm*—Philip Young

[57] ABSTRACT

Reactive ion etching of materials is carried out using a low energy ion beam of controlled energy and current density. The ion beam is generated with an ion source using a single extraction grid having multiple apertures to obtain high current densities at low ion energies. A reactive gas such as $CF_4$ is introduced into the ion source and ionized to form a plasma which acts as the source of ions for the beam. The plasma forms a sheath located adjacent to the single extraction grid such that the ions are extracted from the plasma through the grid apertures and form a low energy ion beam for bombarding the wafers for etching the same. The size of each of the grid apertures is about the same or smaller than the thickness of the plasma sheath adjacent the grid. The ion source is designed to produce an ion current density of about 1 $mA/cm^2$ at a low ion energy of about 10–100 electron volts. This low energy minimizes etching by physical sputtering and allows the chemical component of reactive ion etching to dominate.

7 Claims, 4 Drawing Figures

ION SOURCE FOR REACTIVE ION ETCHING

TECHNICAL FIELD

The present invention relates to reactive ion beam etching processes, and more particularly to a method for providing a low energy ion beam of controlled energy and current density in the reactive ion etching of materials.

BACKGROUND ART

Dry etching of semiconducting and insulating materials by reactive ions is of increasing importance in semiconductor technology as an improvement on wet chemical processes. Three aspects of the dry etching process are identified as follows:

(1) physical sputtering by ions impacting the surface;
(2) chemical etching by reactive neutrals and ions; and
(3) "ion-assisted" etching which occurs in the presence of ion bombardment but at energies where sputtering is negligible.

Three basic types of dry etching processes that involve the above aspects are ion milling, plasma etching, and reactive ion etching.

In ion milling, the main etching process used is almost entirely due to physical sputtering, usually by ions accelerated from a dual-grid ion source.

In plasma etching, the wafers to be etched are placed in a chamber of reactive gas (e.g. $CF_4$) at a pressure of about 1 torr. A glow discharge (plasma) is ignited by an r.f. induction coil outside the chamber. Reactive species are formed by ionization and dissociation in the plasma and diffuse to the wafer surfaces, which are allowed to float close to the plasma potential. Bombardment of the wafer is from all angles, giving isotropic etching of the wafer by mostly energetic neutral gas atoms, for which chemical etching dominates.

Reactive ion etching (RIE) introduces the capability of anisotropic etching, of extreme importance in forming closely spaced surface features. In this process, both chemical etching and ion-assisted etching dominate, and some physical sputtering may occur. The wafers are placed on the cathode of an rf discharge maintained at a pressure of typically 30 millitorr, with cathode voltage of 600 to 900 V. peak-to-peak. The ion sheath which forms above the cathode provides a region of acceleration of positive ions (e.g. $CF_3+$) toward the cathode surface. The ions hit the surface near normal incidence, providing a directionality (anisotropy) of etch rate. The lower pressure assists in maintaining the directionality of the reactive ions.

J. W. Coburn, H. F. Winters and T. J. Chuang in their article entitled "Ion-Surface Interaction in Plasma Etching", Journal of Applied Physics, Vol. 48, No. 8, August, 1977, pp. 3532–3540, describe the use of ion beams for reactive ion etching. Here, a single aperture ion source is used to bombard various substrates of different materials with ion beams of materials such as $CF_3+$, and $Ar+$. The single aperture configuration described is limited to currents in the low microamperes range. Also, the configuration cannot be used to etch large areas uniformly.

The technology of ion sources is of interest in reactive ion etching processes. Ion sources have been employed for many years using multi-aperture, multi-grid accelerator systems. In U.S. Pat. No. 3,156,090 to H. R. Kaufman, issued on Nov. 10, 1964, such a system is shown, which is similar to many sources since used for physical sputtering (ion milling). More recently, D. Pigache describes in an article entitled "A Laboratory Simulation of the Ionospheric Plasma", AIAA Journal, Vol. 11, pp. 129–130, ; February, 1973, a high current density ion source that operates at low ion energy due to a single grid accelerator system. This ion source has been used in ionosphere simulation since it can produce a very dense, low energy plasma. A similar ion extraction means is disclosed in U.S. Pat. No. 3,660,715 to Post where a fine mesh screen or mosaic element 46 is employed.

In U.S. Pat. No. 3,355,615 to Bihan et al, a dual grid accelerator system is shown having a pair of grids with a fine mesh grid added for defining the plasma sheath location.

Although Bihan et al employs a fine mesh screen, it is essentially a dual grid system with a fine mesh screen added to one of the grids. As such, such system does not provide the high current density at low ion energy that is obtainable with the single grid design of Pigache described above.

Another type of dual grid accelerator sysem is disclosed by Margosian et al in U.S. Pat. No. 3,744,247 where a layer of dielectric material is interposed between a metal grid and the chamber in an ion thruster. The effect of the insulator is to produce an accelerating voltage difference similar to that developed in a dual grid system.

Accordingly, it is an object of the present invention to provide a controlled reactive ion etching process, with a minimum of etching due to physical sputtering.

It is another object to provide a reactive ion etching process with an ion beam of high current density and low ion energy.

SUMMARY OF THE INVENTION

The above objects, and other objects, are achieved by the present invention which provides a reactive ion beam etching process for materials which uses a low energy ion beam of controlled energy and current density. The ion beam is generated from an electron bombardment ion source using a single extraction grid having multiple apertures to obtain high current densities at low ion energies.

A reactive gas such as $CF_4$ is introduced into the ion source and ionized to form a plasma which acts as the source of ions for the beam. The plasma forms a sheath located adjacent to the single extraction grid such that the ions are extracted from the plasma through the grid apertures and form a low energy ion beam for bombarding the wafers for etching the same. The size of each of the grid apertures is about the same or smaller than the thickness of the plasma sheath adjacent the grid. The ion source is designed to produce an ion current density of $1 mA/cm^2$ at a low ion energy of about 10–100 electron volts. This low energy minimizes etching by physical sputtering and allows the chemical component of reactive ion etching to dominate.

DESCRIPTION OF THE PREFERRED EMBODIMENTS

Figure 1:
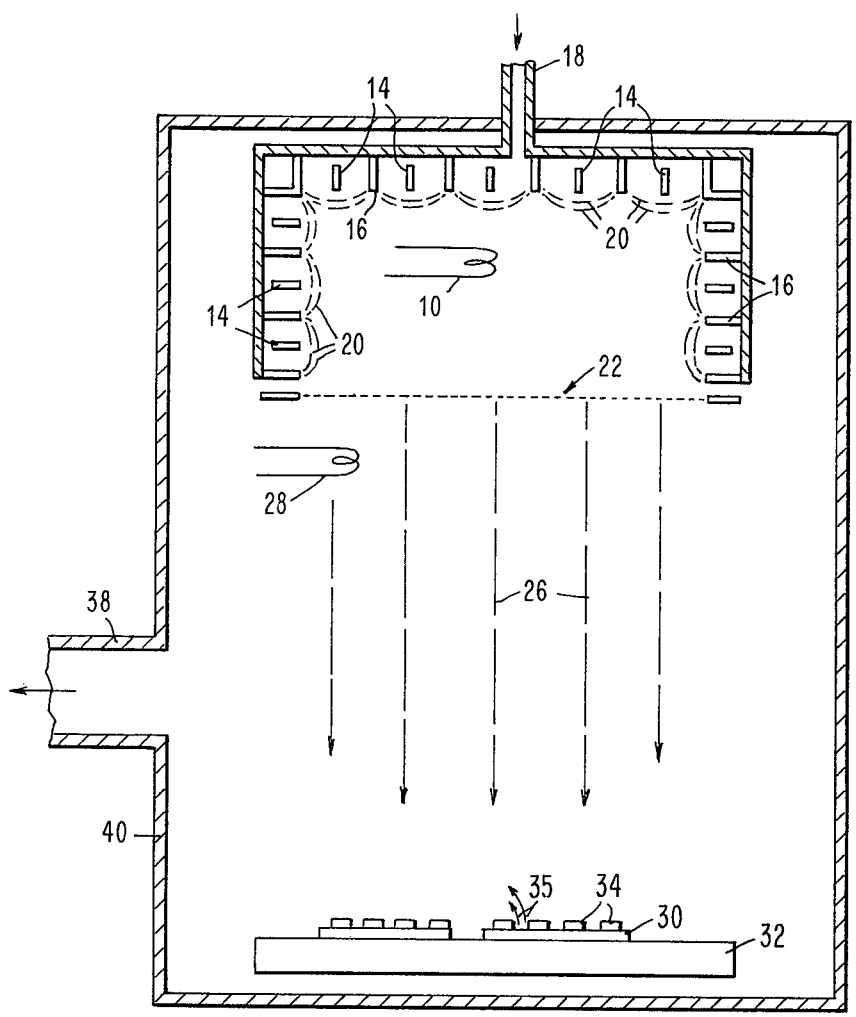
FIG. 1 shows the reactive ion beam etching system in accordance with the present invention.

FIG. 1 shows the reactive ion beam etching system in accordance with the present invention. Here, a single grid ion source together with wafers and holders are contained within a vacuum chamber. Specifically, the ion source includes a thermionic cathode 10 located within the chamber formed by the walls 12 of the ion source. A plurality of anodes 14 are disposed as shown around the ion source adjacent the walls 12 and are made of non-magnetic material such as stainless steel. The anodes 14 are located between pole pieces 16 on both sides of the anodes 14. The pole pieces 16 are made of a magnetically permeable material such as soft iron.

In the operation of the ion source, a reactive gas such as $CF_4$ is provided into the ion source through a gas inlet 18. The gas is ionized by electrons from the cathode 10 which are accelerated to the anodes 14. Magnetic field lines 20 are produced between the pole pieces 16 and enhance the ionization efficiency. A multi-aperture accelerator grid 22 is shown at the lower end of the ion source, details of such grid 22 being described below. A plasma 24 is formed by the ions and electrons in the ion source chamber and provides a source of ions for the ion beam. These ions are extracted from the plasma 24 to the apertures in the accelerator grid 22 and form a beam shown by the ion trajectory lines 26 in the figure.

Electrons are added to the beam 26 from a neutralizer 28 to prevent the charging up of insulating wafers 30. The wafers 30 to be patterned are bombarded with the low energy ion beam 26. Such wafers 30 are mounted on a wafer holder 32 and have masking material 34 on such wafers for delineating the desired patterns.

Reactive species in the beam 26 combine with atoms in the wafer 30 to form etching products indicated by 35. Such etching products 35 are often volatile gases and will be removed by a pumping port 38 from the vacuum chamber indicated by 40. The masking material 34 is chosen so as not to react easily with the beam of ions 26, thereby remaining an effective mask while the wafers 30 are being patterned.

Figure 2:
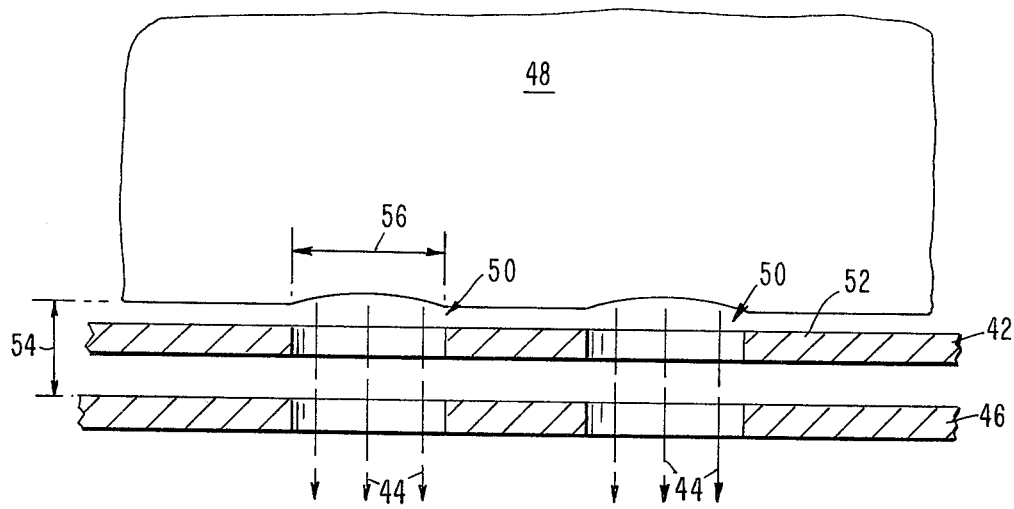
FIG. 2 shows a prior art system comprising a dual-grid ion milling system.

Referring to FIG. 2 there is shown a dual grid ion milling system of the conventional type wherein a screen grid 42 is at a positive potential, close to the potential of the discharge-chamber plasma. Components not shown in FIG. 2 are similar to those shown in FIG. 1. The screen grid 42 serves to define the ion flow into small beamlets or ion trajectories 44 which are directed during normal operation to miss an accelerator grid 46. The plasma is indicated in FIG. 2 by 48 with each aperture indicated by 50. A plasma sheath 52 is formed adjacent the screen grid 42. Here, the acceleration distance of the ions is indicated by 54 and represents the spacing between the accelerator grid 46 and the plasma 48 at the opposite side of the screen grid 42. Here, the ion current density in the ion beam is limited by the acceleration distance 54 which cannot be made smaller than about 1-2 millimeters due to the presence of the screen grid 42.

The accelerator grid 46 is negative relative to the neutralizer cathode, not shown, to prevent backstreaming of neutralizing electrons. Upon leaving the accelerator system, the beamlets from each aperture 50 coalesce to form a broad composite ion beam, not shown, further away from the apertures. The width of the apertures 50 in the grids is indicated by numeral 56.

The current capacity of the two-grid accelerator system is approximated by Child's law, $$j = (4\epsilon_o/9)(2q/m)^{\frac{1}{2}} V^{3/2}/l^2,$$

where (in SI or mks units) $j$ is the current density, $\epsilon_o$ is the permittivity of free space, $q/m$ is the charge-to-mass ratio of the ions, $V$ is the voltage between the grids, and $l$ is the acceleration distance 54 shown in FIG. 2. Child's law clearly shows that if high ion current densities are to be obtained at low voltages, very close grid spacings must be used for two-grid acceleration systems. This problem is particularly serious for large beam diameters, where the close spacing must be maintained over a large beam area. With present two-grid systems, the maximum current densities are on the order of 2-3 $mA/cm^2$ for 500 eV argon ions and beam diameters up to 10 cm. If the argon ion energy is dropped to 100 eV, the current density is dropped by more than a factor of ten.

Additional grids are often used to improve focusing. An intermediate grid between the screen and accelerator grids has been used, as well as a grid grounded to the vacuum facility and neutralizer that is located on the neutralizer side of the accelerator grid. These additional grids, however, do not ease the requirement for close grid spacings at high current densities.

Figure 3B:
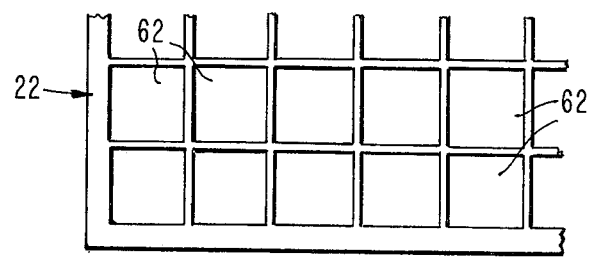
FIG. 3B shows a section of the multi-aperture grid used by the present invention.
Figure 3A:
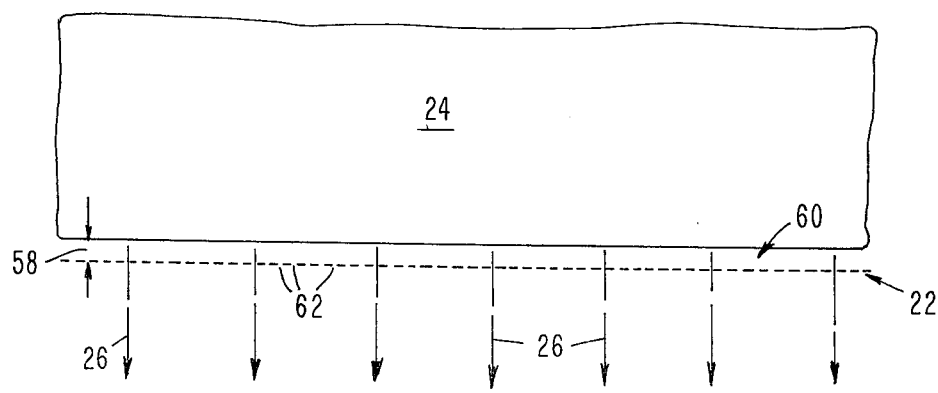
FIG. 3A shows the plasma sheath formed adjacent the acceleration grid in the single grid reactive ion beam etching system in accordance with the present invention.

Referring to FIG. 3A there is shown the single grid reactive ion beam etching system described with respect to FIG. 1. Here, the plasma 24, the accelerator grid 22 and the ion beam trajectories 26 are diagrammatically shown with the identical numerals as those shown and described with respect to FIG. 1. In this single grid system, with the ions accelerated directly from the discharge chamber plasma 24, a plasma sheath 60 forms between the plasma 24 and the accelerator grid 22. The acceleration distance is indicated by numeral 58 and is equal to the thickness of the plasma sheath adjacent the accelerator grid 22. This acceleration distance 58, or thickness of the sheath 60, increases with acceleration voltage, the potential difference between the plasma 24 and the accelerator grid 22. At low acceleration voltages this distance can approach the Debye length of the ions in the plasma, which is typically 0.1 mm.

Therefore, at low ion energy, the single grid system shown in FIGS. 1 and 3 generates more ion current than the dual grid system according to the relationship of Child's law described above. According to Child's law, the current density is inversely proportional to the square of the acceleration distance. The acceleration distance 58 shown in the single grid design of FIG. 3 is the sheath thickness which can be of the order of 0.1 millimeters, while the acceleration distance 54 in the dual-grid design of the prior art shown in FIG. 2 is in the order of 1-2 millimeters due to the presence of the screen grid 42 which places a limitation on the minimum size of the acceleration distance. Applying Child's law to the single grid design, $V$ is the potential difference between the plasma 24 and the accelerator grid 22, and $l$ is the acceleration distance 58. It is apparent that at low ion energy, the single grid system generates more ion current than the dual-grid system.

FIG. 3B shows a portion of the acceleration grid 22 shown in FIG. 3A. It is noted that the acceleration distance 58 shown in FIG. 3A is larger than the size of the aperture 62 for the screen grid 22. The rectangular apertures 62 shown in the embodiment of FIG. 3A is one typical design, however, other shapes of apertures may be employed. In any event, for the screen grids employed in the subject system, the size of the aperture 62 must be about the acceleration distance or sheath thickness 58, or smaller.

EXAMPLE

A single grid ion source was constructed to test the capability of etching semiconductor materials with reactive and inert gas ions. A nickel mesh grid was used with aperture size of 75 microns and wire size 10 microns. The ion beam diameter was 2.5 cm. Using either argon or $CF_4$ (tetrafluoromethane) gas, ion beams of 1 $mA/cm^2$ current density were obtained over the energy range of 20 to 100eV.

In one experiment, wafers of Si and $SiO_2$ were exposed to ion beams of Ar on $CF_4$ of 100eV energy and etch rates were measured.

To obtain 100eV ions, the anodes 14 were held at a positive potential of 100V above ground. The single accelerator grid was held at a negative potential of $-40V$ below ground. A discharge voltage of 40V was maintained between the cathode 10 and anodes 14 to maintain a discharge current of 0.1 amperes. A neutralizer filament 28 was heated by a current of 4 amperes to provide a flow of electrons to the substrate to balance the positive charge from the ion beam. A gas pressure of $2 \times 10^{-4}$ Torr was maintained in the chamber 40.

The wafers were located on a rotating water cooled holder 14 cm from the ion source. A mask was used to generate steps on the etched wafer surfaces which were then measured.

The following results were obtained:
With $CF_4$ gas,
   $SiO_2$ etch rate: 40Å/min.
   Si etch rate: 10Å/min.
With Ar gas,
   $SiO_2$ etch rate: <0.1Å/min.
   Si etch rate: <0.1Å/min.

With Argon gas, only physical sputtering will occur. This etch rate is very low due to the low ion energy involved.

With $CF_4$ gas, chemical and ion-assisted etching of $SiO_2$ and Si occurs, resulting in volatile products such as $SiF_4$, CO, $CO_2$. The etch rates obtained indicate that the high current density, low energy ion beam from the single grid ion source is effective at reactive ion etching.

Selectivity of etch rate between different materials (e.g. $SiO_2$ vs. Si) is important in etching applications. An etch rate ratio of 4 to 1 between $SiO_2$ and Si was obtained. This etch rate ratio may be modified by changing the etching gas composition and ion energy.

The advantages of the multi-aperture, single grid ion source for the reactive ion beam etching process are as follows:

1. High current density of ions in the beam, (several $mA/cm^2$), such current density being easily controlled independent of other system parameters.

2. Low energy of ions in the beam (10-100eV) to minimize the role of physical sputtering. The ion energy is controlled and the output energy distribution of the ion beam is narrow, in the order of a few electron volts. This low energy minimizes ion damage to the wafer.

3. A directional ion beam may be aimed at the substrate at varying angles to produce either vertical etch walls or other wall profiles.

4. Due to the fact that the sheath thickness, and thus the acceleration distance, automatically adjusts itself at the correct distance from the accelerator grid, the ion beam area can be increased to a large diameter of many cm. for large area processing. By contrast, in a dual-grid system, the acceleration distance must be maintained by mechanically holding the two grids at a predetermined required separation therebetween. Thus, the ion source is not only suitable as a research tool, but can be scaled up to production size.

In summary, the subject invention provides a single grid accelerator system to produce a high current low energy ion beam for reactive sputtering and reactive ion etching. Also, high ion current densities are possible in large beam diameters because the acceleration distance is set by the plasma sheath rather than a mechanical spacing between grids.

While the invention has been particularly shown and described with reference to preferred embodiments thereof, it will be understood by those skilled in the art that the foregoing and other changes in form and details may be made therein without departing from the spirit and scope of the invention.

What is claimed is:

1. A reactive ion beam etching process for forming a directed beam of controlled ions at low ion energies, comprising:
   forming an ion plasma with an electron bombardment ion source having anode surfaces, a cathode and magnetic field producing means located around a plasma discharge chamber of said ion source,
   using a single extraction grid having multiple apertures, said extraction grid being located at the end of said discharge chamber,
   applying a voltage potential to said extraction grid which differs from the plasma potential by an amount substantially greater than the electron energy in the plasma and which causes said grid to accelerate the ions from said discharge plasma through said grid apertures into a directed ion beam of high current density at low ion energies, and
   selecting an ion species that reacts chemically with the substrate material to thereby etch the substrate.

2. A process as recited in claim 1 wherein the size of each of said apertures is roughly the same or smaller than the plasma sheath thickness adjacent to said single extraction grid.

3. A process as recited in claim 1, wherein the size of each of said apertures is of the order of 75 microns.

4. A process as recited in claim 3, wherein said extraction grid comprises a solid area between apertures which is about 10 microns wide.

5. A process as recited in claim 1, wherein said anode surfaces ae maintained at a potential of $+100$ volts, said cathode is maintained at a potential of $-40$ volts with respect to said anodes, said extraction grid is maintained at a potential of $-40$ volts with respect to ground, and a gas pressure of $2 \times 10^{-4}$ Torr is maintained in the plasma discharge chamber.

6. A process as recited in claim 1, wherein said ion species comprises $CF_3+$ ions and said substrate material contains silicon.

7. A process are recited in claim 1, wherein said voltage potential applied to said extraction grid is designed to produce ion beams with an ion current density of about 1 $mA/cm^2$ at a low ion energy of about 10-100 electron volts, thereby minimizing etching by physical sputtering and allowing the chemical component of reactive ion etching to dominate.

* * * * *